US012621970B2

(12) United States Patent
Wang et al.

(10) Patent No.: US 12,621,970 B2
(45) Date of Patent: May 5, 2026

(54) ELECTROMAGNETIC INTERFERENCE SHIELD EXTENDING UNDERNEATH MEMORY MODULES

(71) Applicant: Intel Corporation, Santa Clara, CA (US)

(72) Inventors: Pin Jan Wang, Portland, OR (US); Min Suet Lim, Gelugor (MY); Arturo Navarro Alvarez, San Isidro (CR); Hao-Han Hsu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 117 days.

(21) Appl. No.: 18/621,602

(22) Filed: Mar. 29, 2024

(65) Prior Publication Data

US 2025/0311180 A1     Oct. 2, 2025

(51) Int. Cl.
*H05K 9/00*        (2006.01)
*G11C 5/04*        (2006.01)
(52) U.S. Cl.
CPC ............. *H05K 9/0035* (2013.01); *G11C 5/04* (2013.01)
(58) Field of Classification Search
CPC ..................................................... H05K 9/0035
USPC ......................................... 361/818, 816, 799
See application file for complete search history.

(56) References Cited

U.S. PATENT DOCUMENTS

| | | | | |
|---|---|---|---|---|
| 5,195,644 A | * | 3/1993 | Schmid ................. | B65D 1/225 |
| | | | | 220/680 |
| 6,292,373 B1 | * | 9/2001 | Li ....................... | G11B 33/1493 |
| 10,804,651 B1 | * | 10/2020 | Rabbitt ............... | H05K 9/0018 |
| 2004/0130864 A1 | | 7/2004 | Nakatani et al. | |
| 2005/0068758 A1 | * | 3/2005 | Blersch ............... | H05K 9/0032 |
| | | | | 361/818 |
| 2018/0310441 A1 | | 10/2018 | Chang et al. | |
| 2021/0259122 A1 | * | 8/2021 | Lee ..................... | H05K 5/0286 |
| 2022/0232743 A1 | * | 7/2022 | Kuo ..................... | H05K 9/0009 |

FOREIGN PATENT DOCUMENTS

| | | | | | |
|---|---|---|---|---|---|
| EP | | 0726700 A1 | 8/1996 | | |
| EP | | 4553612 A1 | 5/2025 | | |
| KR | | 20120013509 A | * | 2/2012 | ......... H04M 1/0254 |
| WO | | WO-2004109800 A1 | * | 12/2004 | ........... H01L 23/552 |

OTHER PUBLICATIONS

EPO European Extended Search Report in EP Application Serial No. 25158905.7 mailed on Jul. 18, 2025, 7 pages.

* cited by examiner

*Primary Examiner* — Hung S. Bui
(74) *Attorney, Agent, or Firm* — Alliance IP, LLC

(57) ABSTRACT

Devices and systems for shielding electromagnetic interference, and methods of forming the same, are disclosed herein. In one example, an electromagnetic interference (EMI) shield includes a housing to substantially enclose a memory module. When the housing and the memory module are coupled to a circuit board, the housing is to extend at least partially underneath the memory module. The housing may also be openable or at least partially removable.

15 Claims, 13 Drawing Sheets

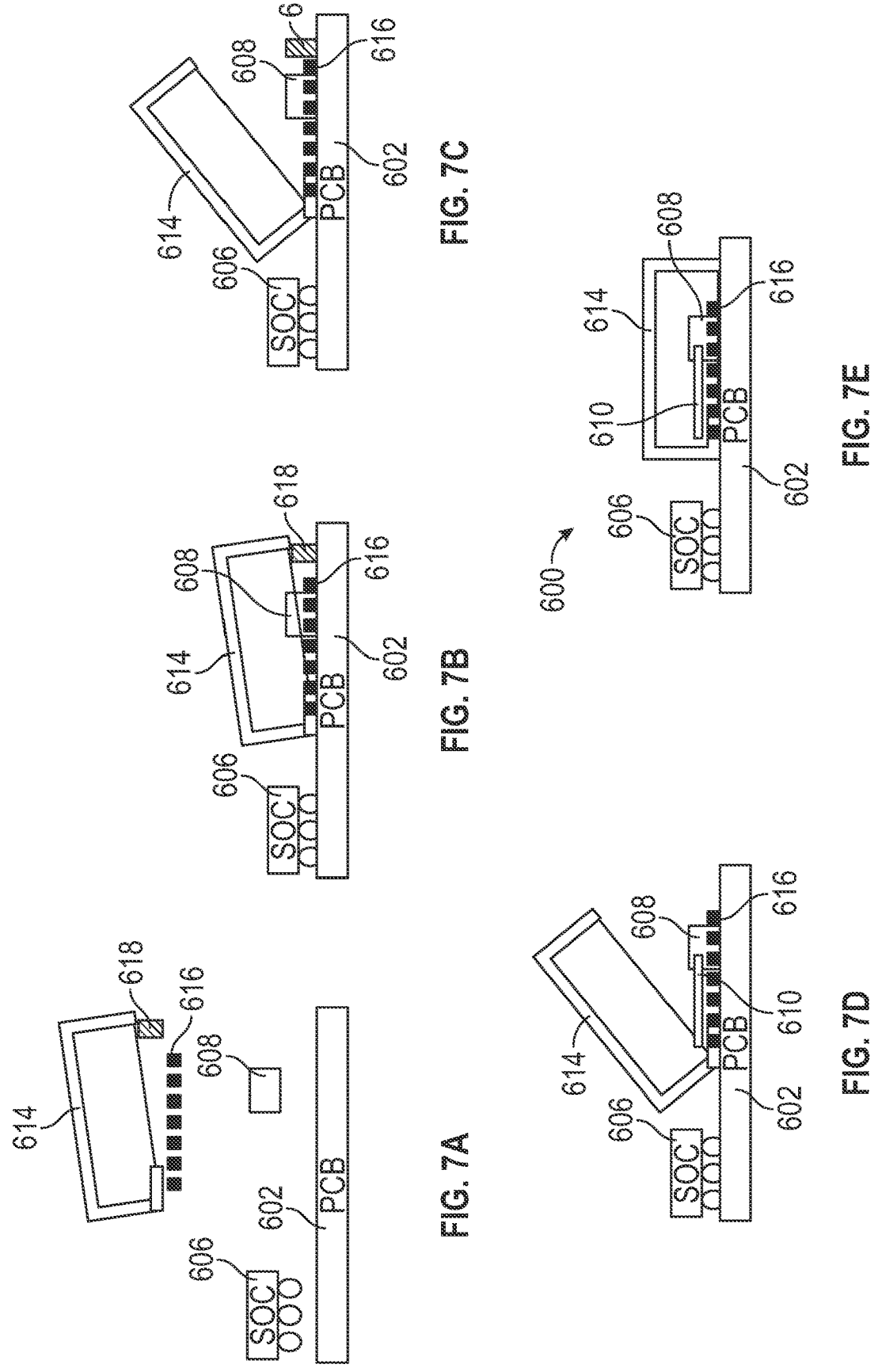

ELECTROMAGNETIC INTERFERENCE SHIELD EXTENDING UNDERNEATH MEMORY MODULES

BACKGROUND

Electromagnetic interference (EMI) shields are crucial for protecting electronic components, such as memory modules, from EMI. As electronic devices continue scaling down in size, however, designing effective EMI shields becomes challenging due to space constraints. For example, as printed circuit boards (PCBs) become smaller and components on PCBs are spaced closer together, the PCB ground contacts and vias for an EMI shield may interfere with other components on a PCB. As a result, EMI shields with less effective designs may be used to accommodate the space constraints, or alternatively, larger PCBs may be used to eliminate the space constraints and avoid sacrificing EMI shielding efficiency. In either case, a compromise is made between EMI shielding efficiency and PCB size.

BRIEF DESCRIPTION OF THE DRAWINGS

FIGS. 7A-E illustrate another example process flow for assembling a system with a one-piece semi-rigid extended EMI shield.

DETAILED DESCRIPTION

Figure 1:
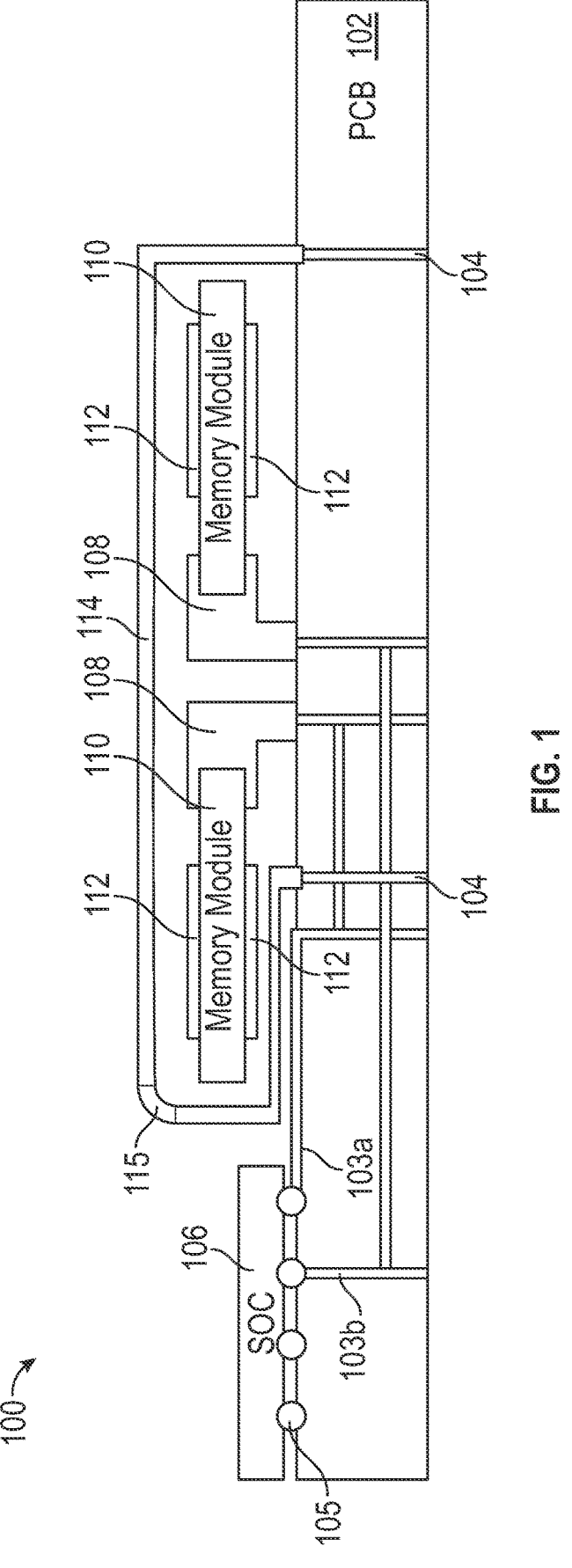
FIG. 1 illustrates an example of a system with a one-piece semi-rigid extended EMI shield for memory modules.

Electromagnetic interference (EMI) is a disturbance caused by an electromagnetic field that can potentially disrupt the operation of an electronic device, which may lead to reduced performance, reliability, and/or safety. Effective EMI mitigation techniques, such as EMI shielding and grounding, are crucial to prevent or minimize negative effects from EMI and ensure proper functioning of an electronic device. For example, EMI shields (which may also be referred to as EMI fences, cans, cages, etc.) are devices designed to block or reduce EMI between electronic components. EMI shields come in a variety of forms—including enclosures, cans, cages, covers, barriers, and sheets—and may be designed to fully or partially enclose electronic components or devices. Moreover, EMI shields are typically made of conductive materials (e.g., metals such as aluminum, copper), which absorb or reflect electromagnetic waves, thus preventing them from penetrating or escaping the shielded area. Accordingly, EMI shields play an important role in minimizing EMI and ensuring the reliable operation of electronic devices and systems.

In some cases, for example, EMI shields may be used to protect memory modules from EMI, such as dual in-line memory modules (DIMMs) or small outline dual in-line memory modules (SODIMMs). A good EMI shield for removable memory modules typically requires a full enclosure around the memory modules to provide effective EMI shielding (e.g., a Faraday cage), along with mechanisms for opening or removing the EMI shield to enable end users to upgrade the memory modules. To fulfill these requirements, removable memory modules such as SODIMMs often use a clip-on EMI can for EMI shielding, which is an EMI enclosure designed to clip in and out of clips attached to ground strips/pads on a printed circuit board (PCB).

If the SODIMM connectors/modules are placed too close to a system-on-a-chip (SoC) and/or central processing unit (CPU), however, PCB ground strips/pads for the EMI can cannot be placed on the side of the SODIMM modules adjacent to the SoC/CPU due to space constraints, as that may interfere with the memory microstrip routing near the SoC/CPU. As a result, a three-sided EMI can is used since there are no PCB ground strips/pads on the fourth side, which leaves the EMI can open on one side, thus trading off EMI shielding efficiency for smaller PCB size.

Alternatively, the SODIMM connectors/modules may be repositioned farther away from the SoC/CPU to make room for PCB ground strips/pads on the fourth side of the EMI can, which enables a four-sided EMI can to be used, thus fully enclosing the memory modules. However, this requires the SODIMM connectors/modules, EMI shield, and PCB ground strip/pads to be shifted by a relatively significant distance (e.g., ~13 mm), which increases the size of the PCB and also requires longer memory routing (e.g., double data rate (DDR) memory microstrip routing).

Another option is using an EMI absorber sheet to envelope the entire top and bottom of the SODIMM area. EMI absorber sheets have adhesive backing, however, which is less effective for multiple reuses and less environmentally friendly than rigid EMI cans, and lower quality EMI absorber sheets often leave behind adhesive residue after they are removed and replaced. EMI absorber sheets are also generally more costly than EMI cans.

Accordingly, this disclosure presents embodiments of EMI shields that extend underneath memory modules, which enables the PCB ground contacts and plated through holes (PTHs) for the side of the EMI shield adjacent to the SoC/CPU to be shifted farther away from the SoC/CPU without moving the memory connectors, memory modules, or EMI shield. In this manner, the EMI shield supports smaller PCB sizes without sacrificing EMI shielding efficiency, as the PCB ground contacts and PTHs do not interfere with the memory routing breakout area, and the EMI shield still fully encloses the memory modules. The EMI shield also supports mechanisms for opening or removing the EMI housing to enable memory modules to be replaced or upgraded.

The described embodiments may provide various advantages. In particular, the EMI shield design provides an enclosed and removable EMI housing without compromising PCB size nor EMI shielding efficiency. For example, the EMI shield design avoids the need for a larger PCB to accommodate the ground strips/pads on the PCB, thus resulting in PCB size and cost savings, which is particularly beneficial for small form factors. The PCB size savings can also be leveraged for other performance benefits, such as maximizing the battery area to increase the size and capacity of the battery. Moreover, the EMI shield design provides more effective EMI shielding by taking advantage of ground contacts/plated through holes (PTHs) placed in optimal locations underneath the memory modules (e.g., to avoid the crowded memory breakout region and maximize the number of ground PTHs connected to the ground strips/pads for the EMI shield). Further, compared to EMI absorber sheets, the extended EMI shields are cheaper and more sustainable, as the leftover residue from EMI absorber sheets is avoided.

The size and cost savings, along with the potential for increased battery size and other performance enhancements, are particularly beneficial for devices with relatively small form factors (e.g., laptops and other small/portable computing devices). In some embodiments, for example, the extended EMI shield may be used with SODIMM modules (e.g., SODIMM/M.2 modules), which are often used in small form factor devices.

Figure 8:
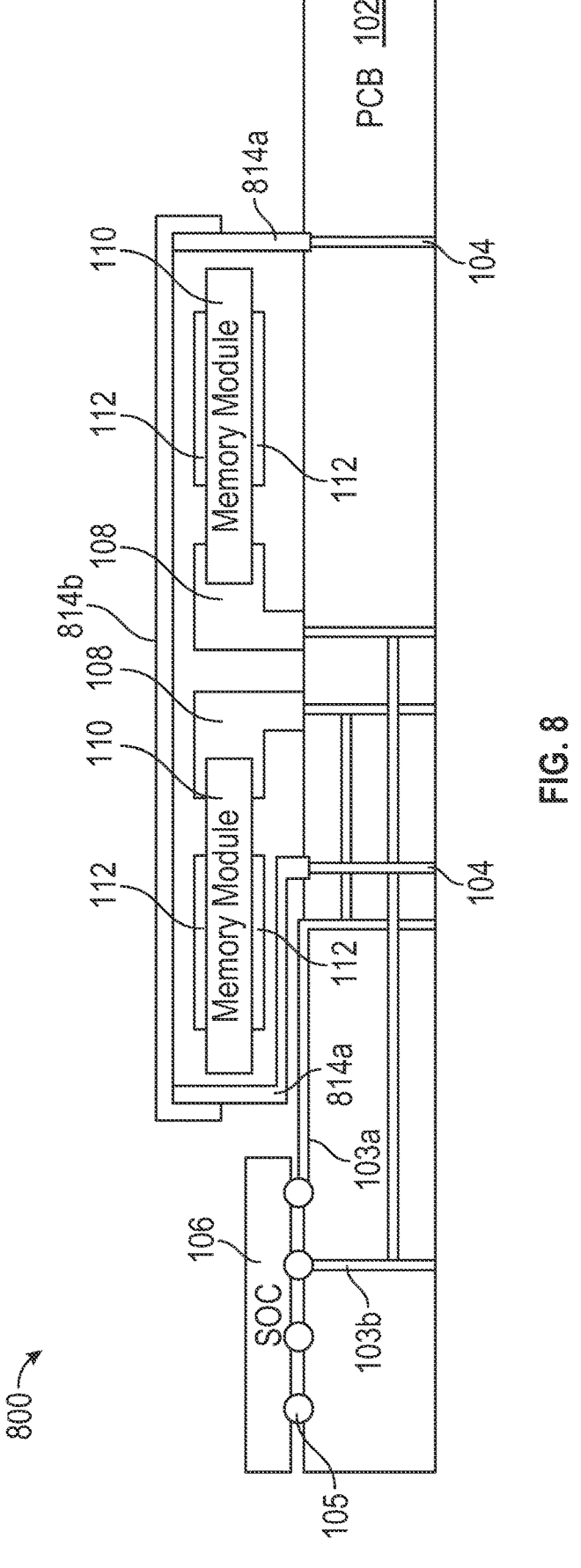
FIG. 8 illustrates an example of a system with a two-piece extended EMI shield for memory modules.
Figure 9:
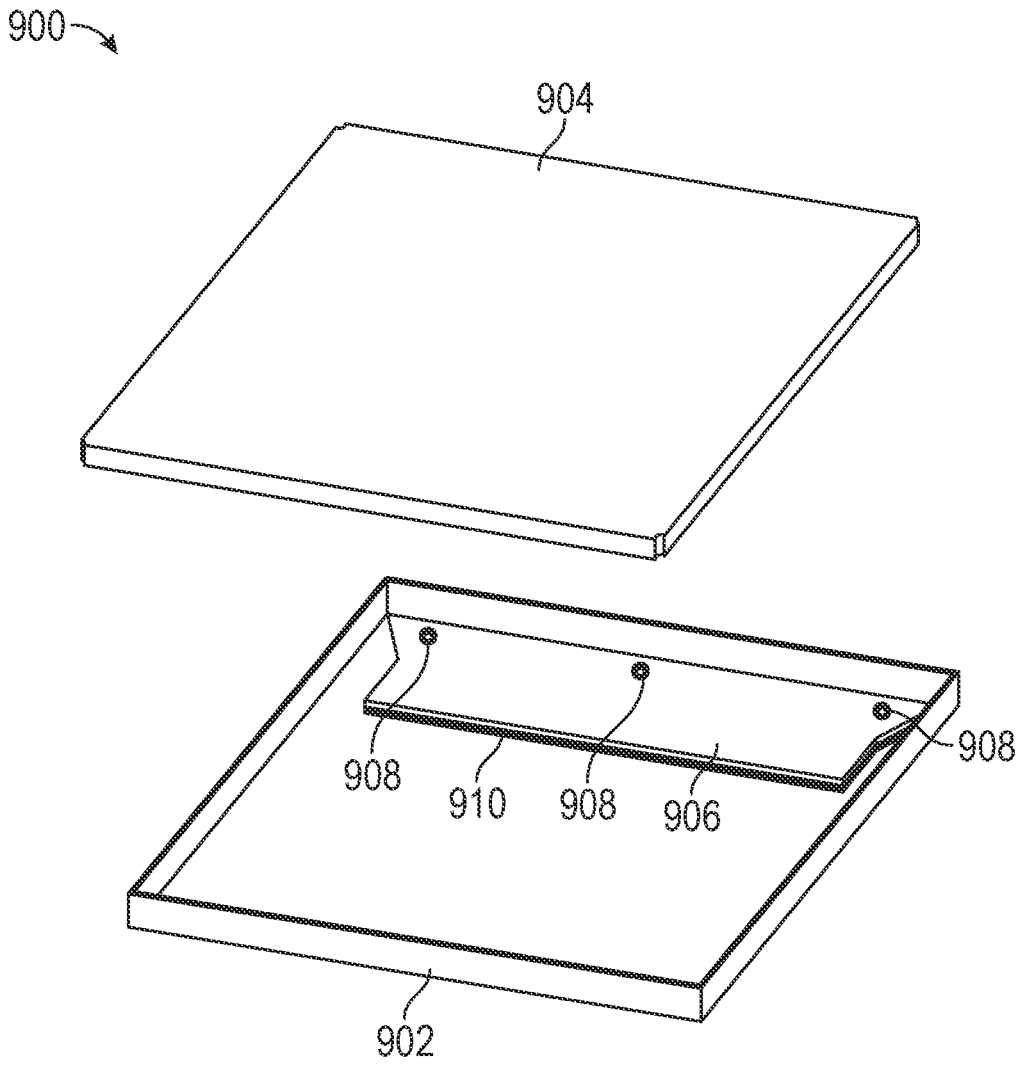
FIG. 9 illustrates an example of a two-piece extended EMI shield for memory modules.

Various embodiments of EMI shields designed to extend underneath memory modules are presented throughout this disclosure. In particular, embodiments of a one-piece semi-rigid extended EMI housing with an openable top or lid are shown in FIGS. 1-7, and embodiments of a two-piece extended EMI housing with a removable lid are shown in FIGS. 8-10.

FIG. 1 illustrates an example of a system 100 with a one-piece semi-rigid extended EMI shield 114 for memory modules 110 (e.g., SODIMMs). In the illustrated embodiment, the EMI shield 114 extends or wraps underneath a memory module 110 adjacent to a system-on-a-chip (SoC) 106, which enables associated ground plated through holes (PTHs) 104 in a printed circuit board (PCB) 102 (e.g., on the side of the EMI shield 114 adjacent to the SoC 106) to be shifted farther away from the SoC 106 without moving the memory connectors 108, memory modules 110, or EMI shield 114. In this manner, the ground PTHs 104 and associated ground contacts (not shown) in the PCB 102 do not interfere with the memory routing channels 103a,b in the PCB 102 (e.g., near the SoC 106), and the EMI shield 114 still fully encloses the memory modules 110, which enables the size of the PCB 102 to be reduced without sacrificing EMI shielding efficiency. The EMI shield 114 also includes a mechanism for opening the housing, which enables the memory modules 110 to be replaced or upgraded. In particular, the EMI shield 114 is a single contiguous piece of semi-rigid housing with a flexible interface 115 at the top/side edge adjacent to the SoC 106, which enables the EMI housing 114 to open and close.

The components of system 100 will now be described in further detail. In the illustrated embodiment, system 100 includes a PCB 102, an SoC 106 coupled to the PCB 102 (e.g., via interconnect/bumps 105), memory connectors 108 (e.g., SODIMM connectors) coupled to the PCB 102, memory modules 110 (e.g., SODIMM modules) removably coupled to the memory connectors 108 (and indirectly coupled to the PCB 102 via the memory connectors 108), and an extended EMI shield 114 coupled to the PCB 102 to enclose the memory modules 110 and associated memory connectors 108.

The PCB 102 includes ground PTHs 104 (e.g., PTHs coupled to ground) and memory routing 103a-b. The EMI shield 114 is coupled to the ground PTHs 104, which couple the EMI shield 114 to ground (e.g., grounding the EMI shield 114). The memory routing 103a-b provides memory channels between the SoC 106 and the respective memory modules 110. The PCB 102 may also include a variety of other components (not shown), such as ground contacts (e.g., ground strips/pads) on the surface of the PCB 102 coupled to the ground PTHs 104, additional interconnect routing (e.g., conductive traces, vias, pads) for power and signaling, etc.

The memory connectors 108 may include any suitable type of memory connectors, such as SODIMM connectors. Similarly, the memory modules 110 may include any suitable type of memory modules, such as SODIMM modules. In the illustrated embodiment, the memory modules 110 are removable, and each memory module 110 includes multiple memory chips 112 (e.g., dynamic random access memory (DRAM)).

The SoC 106 may include a variety of components integrated on the same die, chip, or package, including, without limitation, one or more processors (e.g., central processing units (CPUs)), XPUs, graphics processing units (GPUs), field-programmable gate arrays (FPGAs), application-specific integrated circuits (ASICs), network interface controllers (NICs), persistent storage devices, input/output (I/O) devices and controllers, and/or memory devices and controllers, among other components. In other embodiments, some or all of the components of the SoC 106 may be implemented as standalone components (e.g., disintegrated from the SoC), which may be individually or separately coupled to the PCB 102.

The system 100 may also include a variety of other components (not shown), such as displays, input devices, sensors, thermal management solutions (e.g., a heat sink on top of the SoC 106), etc.

The EMI shield 114 may be used with any suitable type of memory modules 110 or other electronic components that may require EMI shielding. The EMI shield 114 is described in further detail in connection with FIGS. 2-7, which present various examples of one-piece semi-rigid extended EMI shields.

FIGS. 2A-E illustrate an example of a one-piece semi-rigid extended EMI shield 200 for memory modules (e.g., SODIMMs). In the illustrated embodiment, the EMI shield 200 is a single contiguous piece of semi-rigid housing, which is designed to extend or wrap underneath an edge of one of the memory modules, which enables corresponding ground plated through holes (PTHs) and ground contacts (e.g., ground strips/pads) on a printed circuit board (PCB) to be repositioned under the memory module (e.g., farther away from other nearby components such as an SoC/CPU) without shifting the position of the memory modules, memory connectors, or EMI shield 200 on the PCB. In this manner, the ground PTHs and associated ground contacts on the PCB do not interfere with other nearby components on the PCB—such as memory routing for the SoC/CPU—and the EMI shield 200 still fully encloses the memory modules, which enables the size of the PCB to be reduced without sacrificing EMI shielding efficiency. The EMI shield 200 also includes a flexible interface 204 that enables the housing to open and close, which allows memory modules to be inserted/removed after the EMI shield 200 is attached to the PCB.

In the illustrated embodiment, the EMI shield 200 includes a housing designed to substantially enclose the memory modules when attached to a PCB (or another substrate). In particular, the EMI shield housing 200 includes a top portion 202, side walls 203a-d, and a bottom portion 206. The top portion 202 is designed to extend over or cover the top of the memory modules. The side walls 203a-d are designed to extend around or surround the sides/perimeter of the memory modules. The bottom portion 206 is designed to extend at least partially underneath the memory modules (e.g., to enable the ground PTHs/contacts on the PCB to be repositioned under the memory modules).

The EMI shield 200 also includes a flexible interface 204 that enables the housing to open and close. In the illustrated embodiment, for example, the flexible interface 204 is positioned at an edge between the top portion 202 and the side wall 203d adjacent to the bottom portion 206. In some embodiments, the flexible interface 204 may be formed by preforming or bending the semi-rigid EMI shield housing 200 along the edge where the flexible interface 204 is located. In this manner, the flexible interface 204 serves as a hinge that enables the top portion 202 (and three of the side walls 203a-c) to open and close, thus functioning as an openable lid that remains attached to the housing.

The EMI shield 200 also includes corner sidewall covers 207 to cover the openings/slits at the corners of the side walls 203b,c,d adjacent to the flexible interface 204. In the illustrated embodiment, the corner sidewall covers 207 extend from each end of side wall 203d, and they are preformed to bend to an angle slightly less than 90 degrees, thus extending slightly over side walls 203b,c. In this manner, when the EMI housing 200 is closed, the natural spring back force of the corner sidewall covers 207 causes them to make good contact with the EMI housing 200, thus maintaining the seal.

The EMI shield 200 also includes three circular mechanical feet 208 on the bottom portion 206 of the housing, which are designed to be attached to the PCB for structural support, particularly when opening and closing the EMI housing 200.

The EMI shield 200 also includes an edge foot 210 on the bottom portion 206 of the housing, which is a conductive edge designed to be electrically coupled (e.g., soldered) to the ground contacts (e.g., strips/pads) and associated ground PTHs on the PCB.

In some embodiments, for example, the edge foot 210 may be soldered to ground strips/pads on the PCB to permanently attach (and ground) the bottom portion 206 of the housing to the PCB, while the top portion 202 and three of the side walls 203a-c may be removably coupled to clips attached to ground strips/pads on the PCB, which enables those portions to open and close (e.g., via flexible interface 204) by clipping in and out of the clips, while remaining grounded when closed.

Figures 2A, 2B, 2C, 2D, 2E:
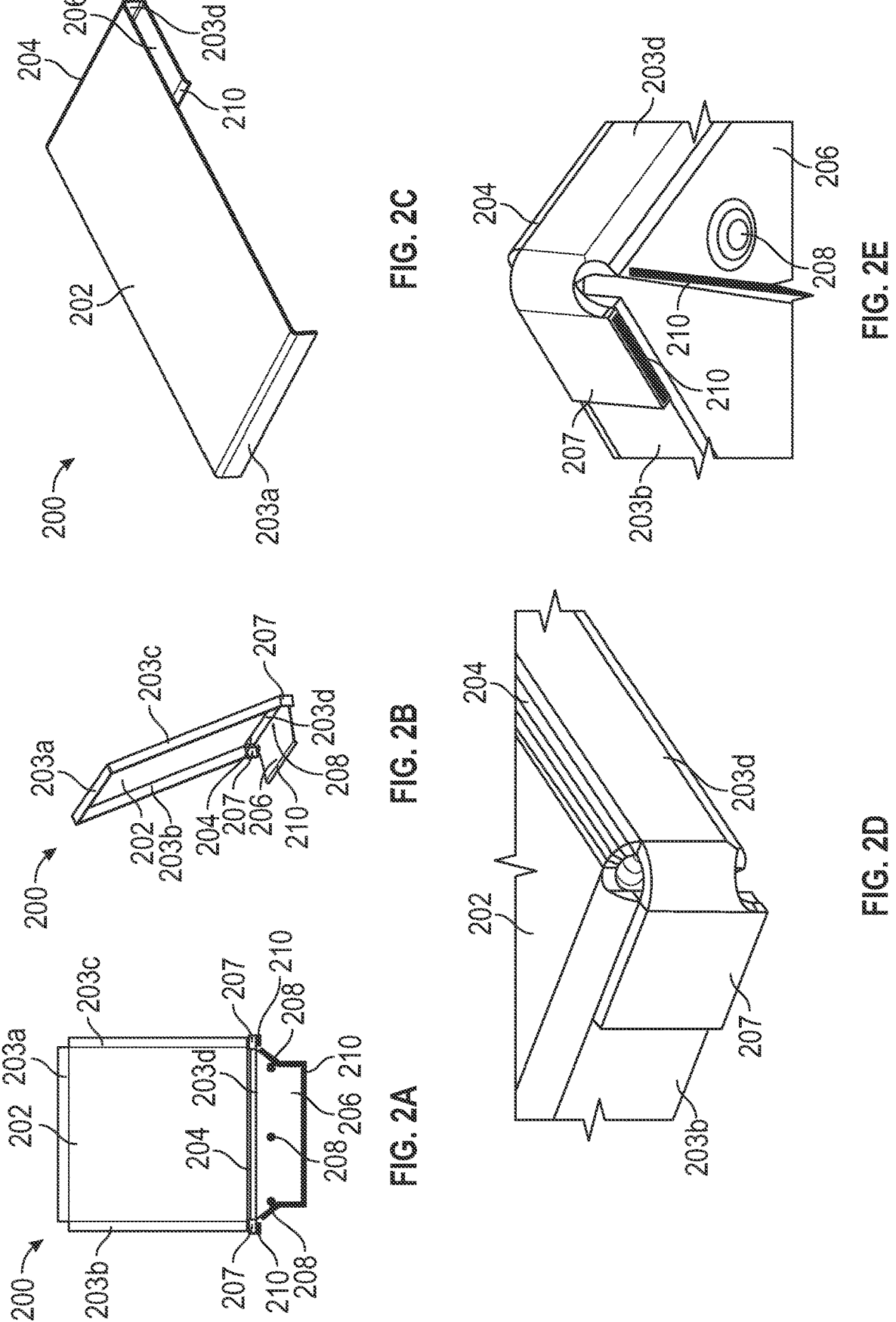
FIGS. 2A-E illustrate an example of a one-piece semi-rigid extended EMI shield for memory modules.

In FIG. 2A, the one-piece semi-rigid EMI housing 200 is shown prior to assembly (e.g., before the edges between the respective top 202, sides 203a-d, and bottom 206 are bent to shape the housing 200 into an enclosure).

In FIG. 2B, the EMI housing 200 is shown in the open position (e.g., with the top portion 202 and three of the side walls 203a-c open).

In FIG. 2C, a cross-section view of the EMI housing 200 is shown in the closed position.

In FIG. 2D, a magnified view of the EMI housing 200 is shown to depict the flexible interface 204 and corner sidewall covers 207 in further detail.

In FIG. 2E, another magnified view of the EMI housing 200 is shown to depict the corner sidewall covers 207, conductive edge foot 210, and mechanical feet 208 in further detail.

Figures 3A, 3B, 3C:
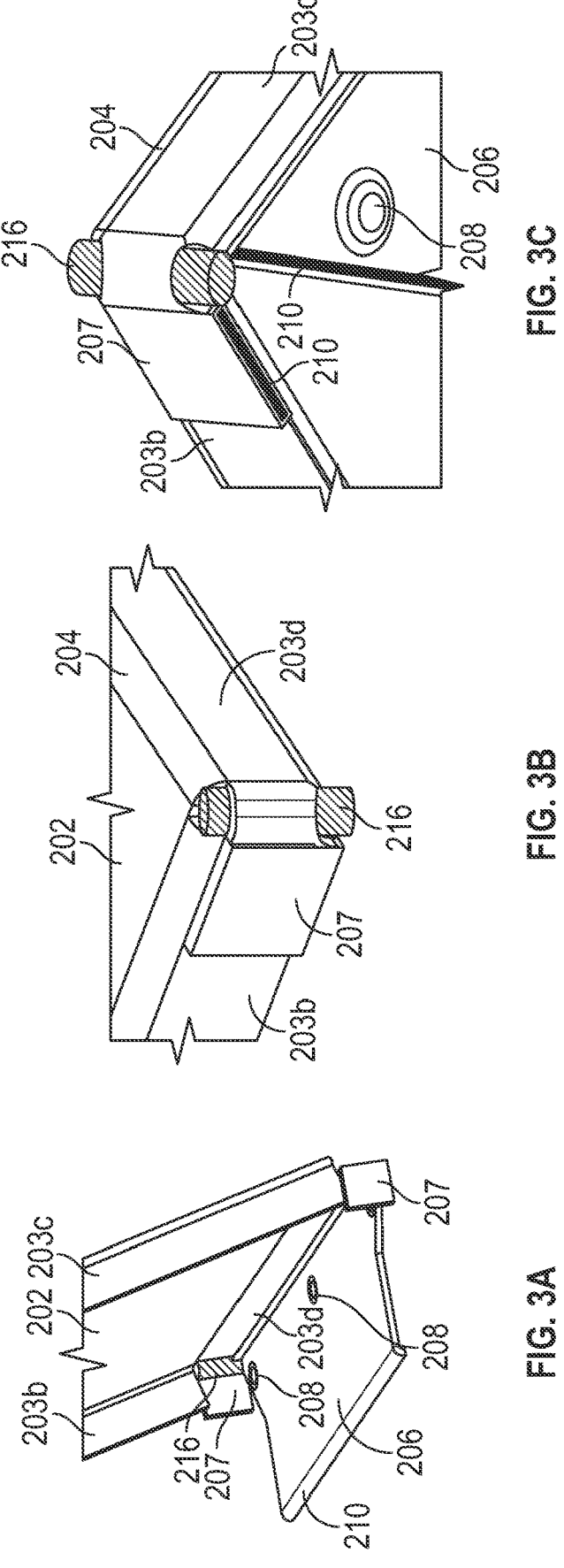
FIGS. 3A-C illustrate an example of EMI gaskets in a one-piece semi-rigid extended EMI shield.

FIGS. 3A-C illustrate an example of EMI gaskets 216 in extended EMI shield 200. In particular, EMI gaskets 216 are inserted in (e.g., interior to) the corner sidewall covers 207 to fully seal the remaining open areas around the corner sidewall covers 207. EMI gaskets 216 are typically used to provide EMI shielding in specific areas of an enclosure, such as between mating surfaces. EMI gaskets 216 are typically made of conductive materials such as metal, conductive elastomers, and/or metal-coated elastomers. In this manner, EMI gaskets 216 provide a conductive barrier that absorbs or reflects electromagnetic radiation, thus preventing it from passing through.

Figure 4:
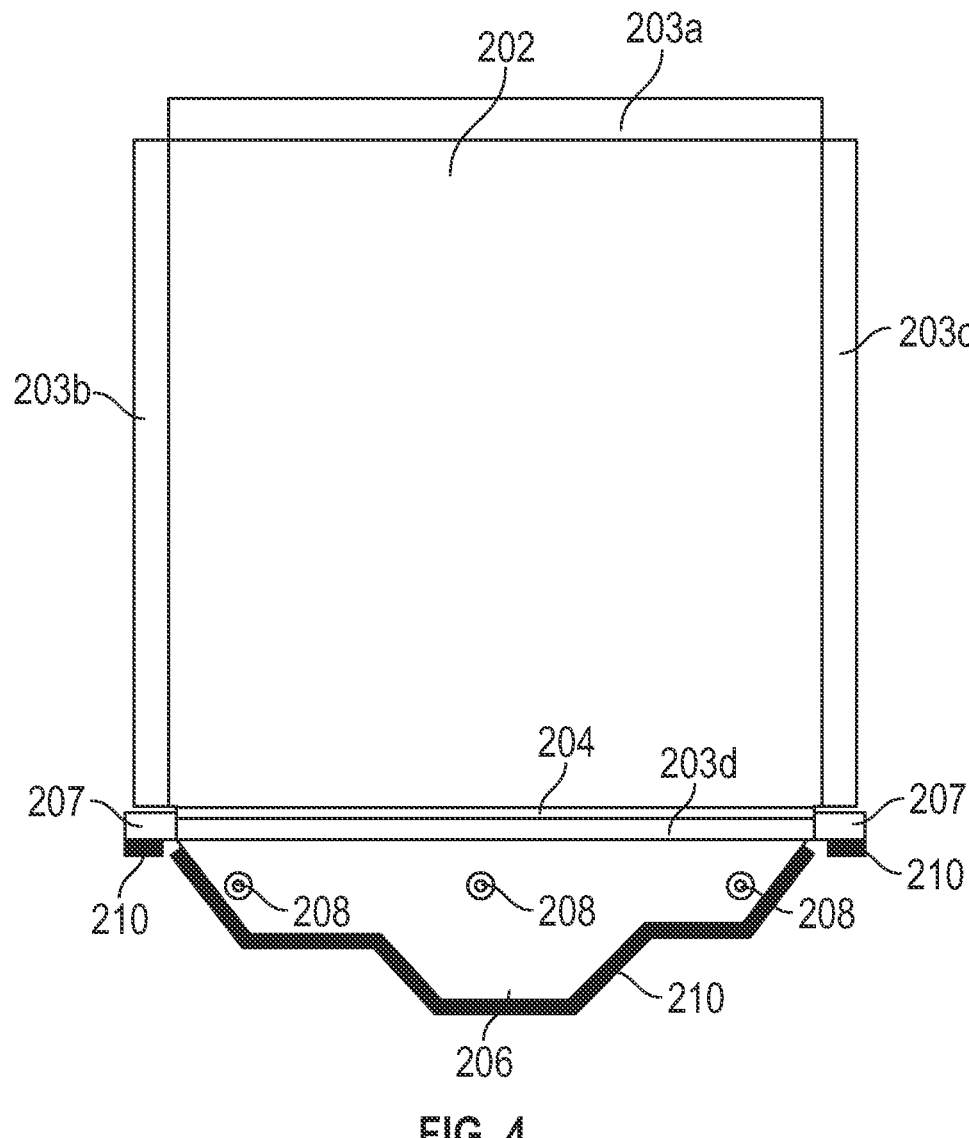
FIG. 4 illustrates an example of a one-piece semi-rigid extended EMI shield with a bottom edge designed for optimal placement of ground connections.

FIG. 4 illustrates an example of a one-piece semi-rigid extended EMI shield 400 with a bottom edge designed for optimal placement of PCB ground connections. In the illustrated embodiment, EMI shield 400 is similar to EMI shield 200, except the edge of the bottom portion 206 is reshaped to mirror the optimal placement of ground contacts (e.g., strips/pads) and plated through holes (PTHs) on a PCB. For example, by taking advantage of the EMI shield extension 206 underneath the memory modules, ground strips/pads and PTHs can be placed wherever PCB space is available by tailoring the shape of the bottom edge of the extension 206. In this manner, the design of EMI shield 400 enables flexible ground contact/PTH placement on the PCB, as there are no placement restrictions tied to the outer footprint of the EMI shield 400. As a result, the number of ground PTHs can be increased while the spacing between them is reduced (e.g., ~3 mm), thus increasing the PTH density, which improves the EMI shielding effectiveness.

FIGS. 5A-D illustrate perspective views of a system 500 with a one-piece semi-rigid extended EMI shield 514 for memory modules 510. In some embodiments, the EMI shield 514 may be implemented using the designs of EMI shields 200, 400.

In the illustrated example, the system 500 includes a PCB 502, memory connectors 508 (e.g., SODIMM connectors) coupled to the PCB 502, memory modules 510 (e.g., SODIMM modules) removably coupled to the memory connectors 508, memory chips 512 (e.g., DRAM) on the memory modules 510, an EMI shield 514 covering the memory modules 510 with an extension 515 partially underneath the memory modules 510, and a set of clips 516 coupled to ground contacts (e.g., strips/pads) and associated plated through holes (PTHs) on the PCB 502.

In the illustrated embodiment, the bottom portion 515 of the EMI shield 514 is soldered to ground strips/pads on the PCB 502, thus permanently attaching and grounding the bottom portion 515 of the shield 514 to the PCB 502. However, the top portion and three of the side walls of the EMI shield 514 are removably coupled to the clips 516 attached to ground strips/pads on the PCB, which enables the EMI shield 514 to open and close by clipping in and out of the clips, while remaining grounded when closed.

Figures 5A, 5B, 5C, 5D:
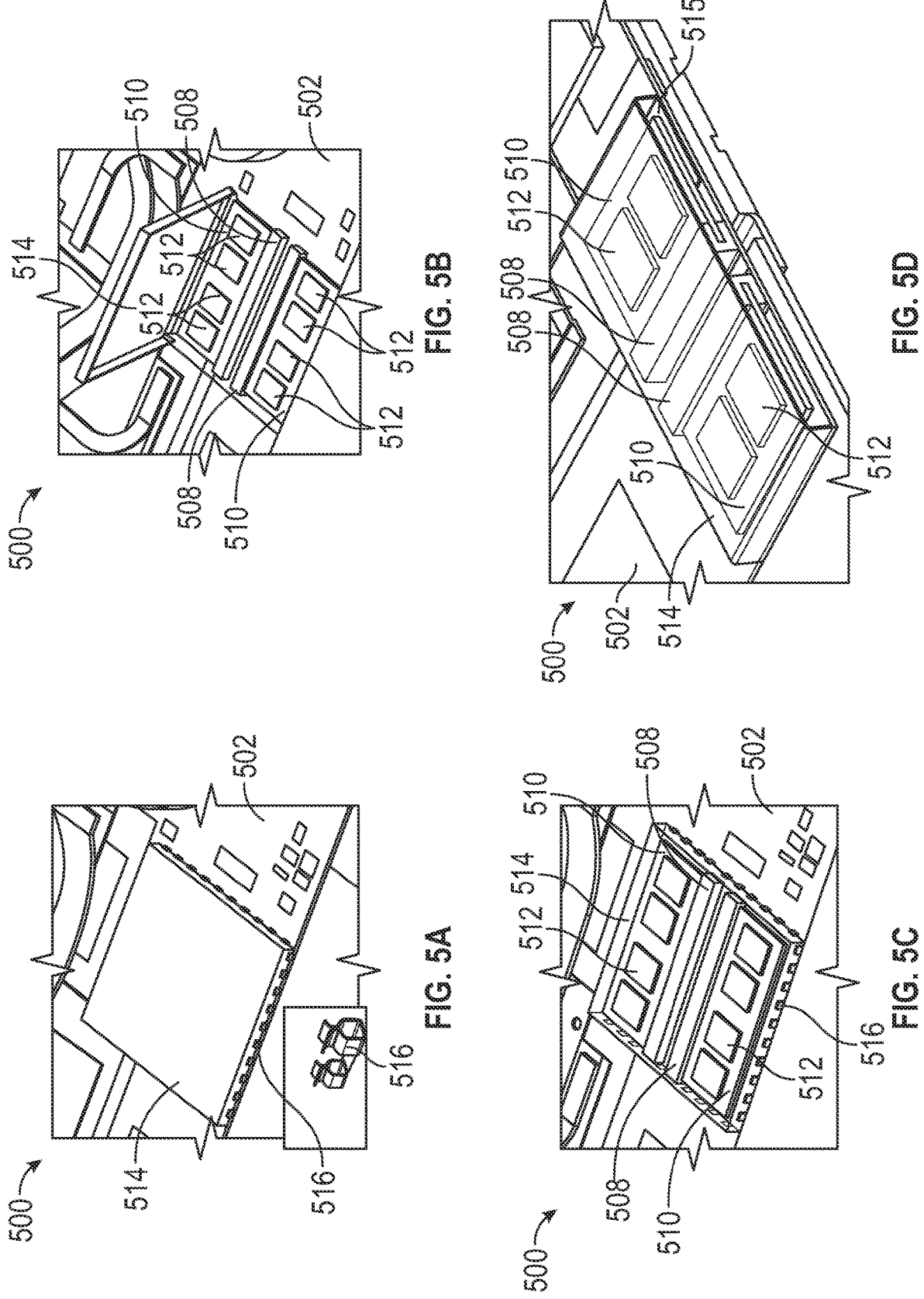
FIGS. 5A-D illustrate perspective views of a system with a one-piece semi-rigid extended EMI shield for memory modules.

In FIG. 5A, the EMI shield 514 is shown in the closed position, with a magnified view of the clips 516 also shown.

In FIG. 5B, the EMI shield 514 is shown in the open position, with the memory connectors 508, memory modules 510, and memory chips 512 shown.

In FIG. 5C, the EMI shield 514 is shown in the closed position with transparency to depict the memory connectors 508, memory modules 510, and memory chips 512 housed within the shield 514.

In FIG. 5D, a cross-section view of the EMI shield 514 is shown in the closed position with transparency to depict the memory connectors 508, memory modules 510, and memory chips 512 housed within the shield 514, along with the extension 515 underneath the memory modules 510.

FIGS. 6A-E illustrate an example process flow for assembling a system 600 with a one-piece semi-rigid extended EMI shield 614. In some embodiments, the EMI shield 614 may be implemented using the designs of EMI shields 200, 400. It will be appreciated in light of the present disclosure that the illustrated process flow is only one example methodology for arriving at a system 600 with a one-piece semi-rigid extended EMI shield 614.

In the illustrated example, the process flow is optimized to reduce the number of reflow steps by pre-inserting the EMI shield 614 into the clips 616, thus reducing two reflow steps for the EMI shield 614 and clips 616, respectively, into a single reflow step.

Figures 6A, 6B, 6C, 6D, 6E:
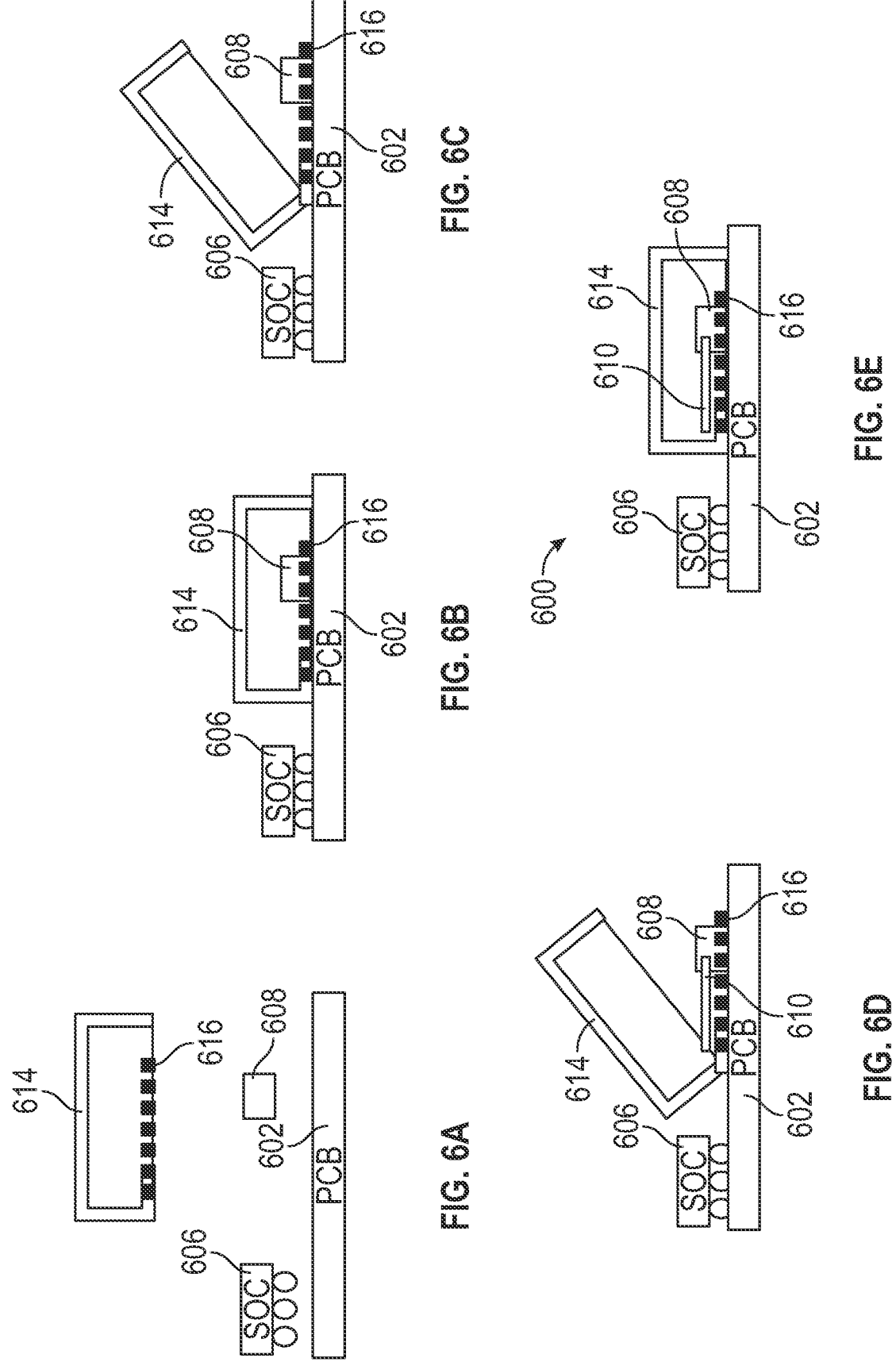
FIGS. 6A-E illustrate an example process flow for assembling a system with a one-piece semi-rigid extended EMI shield.

In FIG. 6A, a printed circuit board (PCB) 602, a system-on-a-chip (SoC) 606, a memory connector 608 (e.g., a SODIMM connector), a set of clips 616, and an electromagnetic interference (EMI) shield 614 are received. The EMI shield 614 includes a top portion and a bottom portion, where the bottom portion is designed to extend at least partially underneath a memory module (e.g., a SODIMM module) and the top portion is openable (e.g., an openable lid). Moreover, the EMI shield 614 is "pre-inserted" into the clips 616. For example, before the components are attached to the PCB 602, the EMI shield 614 is inserted into the clips 616 (or the clips 616 are clipped onto the EMI shield 614), thus enabling the EMI shield 614 and the clips 616 to be attached to the PCB 602 with a single reflow.

In FIG. 6B, the SoC 606, memory connector 608, clips 616, and EMI shield 614 (pre-inserted into the clips 616) are pick-and-placed onto the PCB 602 and attached via reflow.

In FIG. 6C, the top portion/lid of the EMI shield 614 is opened.

In FIG. 6D, a memory module 610 (e.g., a SODIMM module) is inserted into the memory connector 608.

In FIG. 6E, the top portion/lid of the EMI shield 614 is closed.

FIGS. 7A-E illustrate another example process flow for forming a system 600 with a one-piece semi-rigid extended EMI shield 614. In some embodiments, the EMI shield 614 may be implemented using the designs of EMI shields 200, 400. It will be appreciated in light of the present disclosure that the illustrated process flow is only one example methodology for arriving at a system 600 with a one-piece semi-rigid extended EMI shield 614.

In the illustrated example, the process flow is optimized to reduce the number of reflow steps using a temporary standoff 618 to hold the EMI shield 614 during the reflow process, which is subsequently removed after insertion of the memory module 610.

In FIG. 7A, a printed circuit board (PCB) 602, a system-on-a-chip (SoC) 606, a memory connector 608 (e.g., SODIMM connector), a set of clips 616, an electromagnetic interference (EMI) shield 614, and a temporary standoff 618 are received.

In FIG. 7B, the SoC 606, memory connector 608, clips 616, and EMI shield 614 are pick-and-placed onto the PCB 602, with the temporary standoff 618 inserted between the PCB 602 and the openable end of the EMI shield 614. The components are then attached to the PCB 602 via reflow.

In FIG. 7C, the top portion/lid of the EMI shield 614 is opened.

In FIG. 7D, the temporary standoff 618 is removed, and a memory module 610 (e.g., SODIMM module) is inserted into the memory connector 608.

In FIG. 7E, the top portion/lid of the EMI shield 614 is closed.

FIG. 8 illustrates an example of a system 800 with a two-piece extended EMI shield 814 for memory modules 110. In the illustrated embodiment, system 800 is similar to system 100, except the EMI shield 814 is designed as a two-piece housing with a bottom portion 814a (e.g., base) and a top portion 814b (e.g., removable lid), which are collectively referred to as EMI shield 814. Moreover, the EMI shield 814 is partially removable. For example, the lid 814b may be designed to clip or snap on and off the base 814a. In this manner, the lid 814b can be removed to add and/or remove memory modules 110.

Further, the EMI shield 814 extends or wraps underneath the memory module 110 adjacent to the SoC 106, which enables the associated ground PTHs 104 in the PCB 102 (e.g., on the side of the EMI shield 814 adjacent to the SoC 106) to be shifted farther away from the SoC 106 without moving the memory connectors 108, memory modules 110, or EMI shield 814. In this manner, the ground PTHs 104 and associated ground contacts (not shown) in the PCB 102 do not interfere with the memory routing channels 103a,b in the PCB 102 (e.g., near the SoC 106), and the EMI shield 814 still fully encloses the memory modules 110, which enables the size of the PCB 102 to be reduced without sacrificing EMI shielding efficiency.

FIG. 9 illustrates an example of a two-piece extended EMI shield 900 for memory modules (e.g., SODIMMs). In the illustrated embodiment, the EMI shield 900 is two-piece EMI housing with a bottom portion 902 (referred to as the base) and a top portion 904 (referred to as the lid), which are collectively designed to substantially enclose memory modules when attached to a printed circuit board (PCB) (or another substrate).

The base 902 includes side walls designed to extend around or surround the sides/perimeter of the memory modules. The lid 904 includes a top cover designed to extend over or cover the top of the memory modules, along with side walls designed to overlap with the corresponding side walls on the base 902. Moreover, the lid 904 is removable and may be designed to clip or snap on and off the base 902, thus enabling memory modules to be added or removed after the EMI shield 900 has been assembled.

Further, the base 902 of the EMI shield 900 includes a bottom extension 906 designed to extend or wrap underneath an edge of one of the memory modules, which enables corresponding ground contacts (e.g., strips/pads) and plated through holes (PTHs) on the PCB to be repositioned under the memory module (e.g., farther away from other nearby components such as an SoC/CPU) without shifting the position of the memory modules, memory connectors, or EMI shield 900 on the PCB. In this manner, the ground contacts and PTHs on the PCB do not interfere with other nearby components on the PCB—such as memory routing for the SoC/CPU—and the EMI shield 900 still fully encloses the memory modules, which enables the size of the PCB to be reduced without sacrificing EMI shielding efficiency.

The EMI shield 900 also includes three circular mechanical feet 908 on the bottom extension 906 of the base 902, which are designed to be attached to the PCB for structural support.

The EMI shield 900 also includes an edge foot 910 on the bottom extension 906 of the base 902, which is a conductive edge designed to be electrically coupled (e.g., soldered) to the ground contacts (e.g., strips/pads) and associated ground PTHs on the PCB.

In some embodiments, for example, the base 902 and the edge foot 910 on the bottom extension 906 may be soldered to ground strips/pads on the PCB to permanently attach (and ground) the base 902 of the housing 900 to the PCB, while the removable lid 904 may be removably clipped or snapped on and off the base 902.

Figures 10A, 10B, 10C:
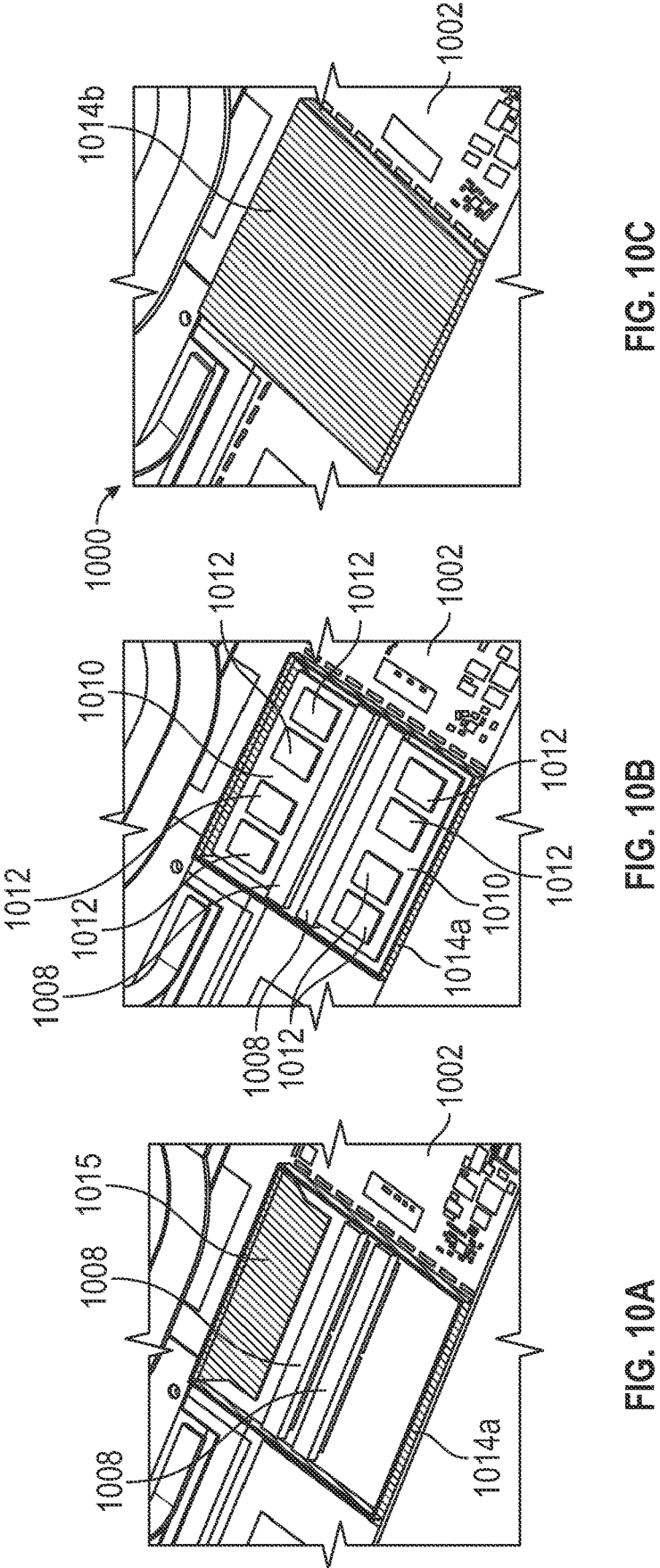
FIGS. 10A-C illustrate an example process flow for assembling a system with a two-piece extended EMI shield.

FIGS. 10A-C illustrate an example process flow for forming a system 1000 with a two-piece extended EMI shield 1014. In some embodiments, the EMI shield 1014 may be implemented using the design of EMI shield 900. It will be appreciated in light of the present disclosure that the illustrated process flow is only one example methodology for arriving at a system 1000 with a two-piece extended EMI shield 1014.

In FIG. 10A, a printed circuit board (PCB) 1002, memory connectors 1008 (e.g., SODIMM connectors), and an electromagnetic interference (EMI) shield 1014 are received. The EMI shield 1014 includes a bottom portion (base) 1014*a* and a top portion (removable lid) 1014*b*, which are collectively referred to as EMI shield 1014, where the bottom portion 1014*a* includes side walls and a bottom extension 1015 to extend at least partially underneath an edge of one of the memory modules (e.g., SODIMM) and the top portion 1014*b* is removable (e.g., a removable lid). The memory connector 1008 and the base 1014*a* of the EMI shield 1014 are pick-and-placed onto the PCB 1002 and attached via reflow. In some embodiments, other components may also be attached to the PCB 1002 (e.g., an SoC).

In FIG. 10B, memory modules 1010 (e.g., SODIMMs) with memory chips 1012 (e.g., DRAM) are inserted into the memory connectors 1008.

In FIG. 10C, after the memory modules 1010 are inserted into the memory connectors 1008, the top portion 1014*b* (e.g., the removable lid) of the EMI shield 1014 is attached or clipped onto the bottom portion 1014*a* (e.g., the base) of the EMI shield 1014.

Figure 11:
FIG. 11 illustrates a graph demonstrating the EMI shielding performance of an extended EMI shield for memory modules.

FIG. 11 illustrates a graph 1100 showing the EMI shielding performance of an extended EMI shield. In particular, graph 1100 shows electromagnetic radiation detected when using no shield 1101 versus the extended EMI shield 1102. In the illustrated performance evaluation, a SODIMM module and associated connector are implemented on a PCB, and a Wi-Fi antenna is placed approximately 1 inch from the edge of the SODIMM module. The radiation from SODIMM is captured by simulating the coupling between the microstrip on the SODIMM module and the Wi-Fi antenna. As shown in performance graph 1100, the extended EMI shield design 1102 provides over 10 decibels (dB) of shielding effectiveness across all Wi-Fi bands. Thus, the extended EMI shield 1102 has similar or better shielding effectiveness as conventional EMI shields, while providing other benefits such as smaller PCB size and optimized ground PTH placement.

Figure 12:
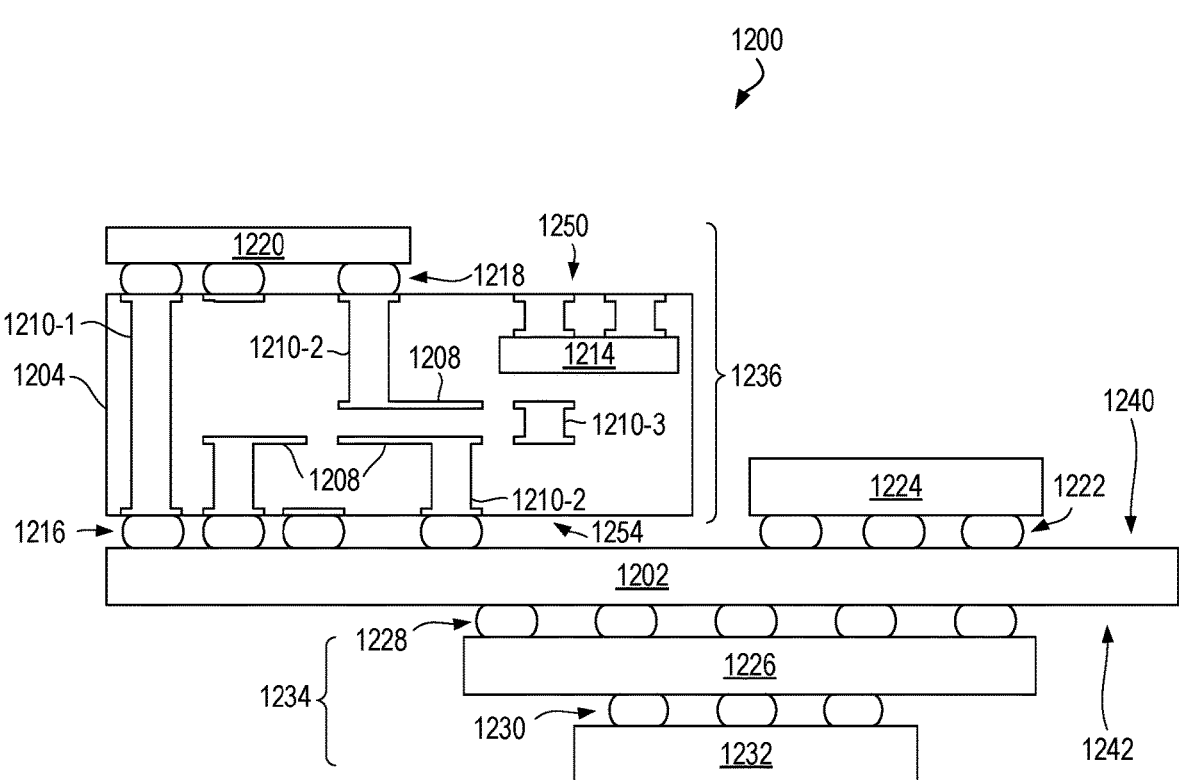
FIG. 12 illustrates a cross-sectional side view of an integrated circuit device assembly in accordance with certain embodiments.

FIG. 12 is a cross-sectional side view of an integrated circuit device assembly 1200 that may include any of the embodiments disclosed herein. In some embodiments, for example, the IC components 1220, 1224, 1226, 1232 of the integrated circuit device assembly 1200 may include one or more EMI shields according to any of the embodiments disclosed herein (e.g., EMI shield 114, 200, 400, 514, 614, 814, 900, 1014), such as an EMI shield that extends partially underneath one or more memory modules.

In some embodiments, the integrated circuit device assembly 1200 may be a microelectronic assembly. The integrated circuit device assembly 1200 includes a number of components disposed on a circuit board 1202 (which may be a motherboard, system board, mainboard, etc.). The integrated circuit device assembly 1200 includes components disposed on a first face 1240 of the circuit board 1202 and an opposing second face 1242 of the circuit board 1202; generally, components may be disposed on one or both faces 1240 and 1242. Any of the integrated circuit components discussed below with reference to the integrated circuit device assembly 1200 may take the form of any suitable ones of the embodiments of the microelectronic assemblies disclosed herein.

In some embodiments, the circuit board 1202 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1202. In other embodiments, the circuit board 1202 may be a non-PCB substrate. The integrated circuit device assembly 1200 illustrated in FIG. 12 includes a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 12), pins (e.g., as part of a pin grid array (PGA), contacts (e.g., as part of a land grid array (LGA)), male and female portions of a socket, an adhesive, an underfill material, and/or any other suitable electrical and/or mechanical coupling structure. The coupling components 1216 may serve as the coupling components illustrated or described for any of the substrate assembly or substrate assembly components described herein, as appropriate.

The package-on-interposer structure 1236 may include an integrated circuit component 1220 coupled to an interposer 1204 by coupling components 1218. The coupling components 1218 may take any suitable form for the application, such as the forms discussed above with reference to the coupling components 1216. Although a single integrated circuit component 1220 is shown in FIG. 12, multiple integrated circuit components may be coupled to the interposer 1204; indeed, additional interposers may be coupled to the interposer 1204. The interposer 1204 may provide an intervening substrate used to bridge the circuit board 1202 and the integrated circuit component 1220.

The integrated circuit component 1220 may be a packaged or unpackaged integrated circuit product that includes one or more integrated circuit dies and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1220, a single monolithic integrated circuit die comprises solder bumps attached to contacts on the die. The solder bumps allow the die to be directly attached to the interposer 1204. The integrated circuit component 1220 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1220 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1220 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1220 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1204 may spread connections to a wider pitch or reroute a connection to a different connection. For example, the interposer 1204 may couple the integrated circuit component 1220 to a set of ball grid array (BGA) conductive contacts of the coupling components 1216 for coupling to the circuit board 1202. In the embodiment illustrated in FIG. 12, the integrated circuit component 1220 and the circuit board 1202 are attached to opposing sides of the interposer 1204; in other embodiments, the integrated circuit component 1220 and the circuit board 1202 may be attached to a same side of the interposer 1204. In some embodiments, three or more components may be interconnected by way of the interposer 1204.

In some embodiments, the interposer 1204 may be formed as a PCB, including multiple metal layers separated from one another by layers of dielectric material and interconnected by electrically conductive vias. In some embodiments, the interposer 1204 may be formed of an epoxy resin, a fiberglass-reinforced epoxy resin, an epoxy resin with inorganic fillers, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through hole vias 1210-1 (that extend from a first face 1250 of the interposer 1204 to a second face 1254 of the interposer 1204), blind vias 1210-2 (that extend from the first or second faces 1250 or 1254 of the interposer 1204 to an internal metal layer), and buried vias 1210-3 (that connect internal metal layers).

In some embodiments, the interposer 1204 can comprise a silicon interposer. Through silicon vias (TSV) extending through the silicon interposer can connect connections on a first face of a silicon interposer to an opposing second face of the silicon interposer. In some embodiments, an interposer 1204 comprising a silicon interposer can further comprise one or more routing layers to route connections on a first face of the interposer 1204 to an opposing second face of the interposer 1204.

The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art. In embodiments where the interposer is a non-printed circuit board The integrated circuit device assembly 1200 may include an integrated circuit component 1224 coupled to the first face 1240 of the circuit board 1202 by coupling components 1222. The coupling components 1222 may take the form of any of the embodiments discussed above with reference to the coupling components 1216, and the integrated circuit component 1224 may take the form of any of the embodiments discussed above with reference to the integrated circuit component 1220.

The integrated circuit device assembly 1200 illustrated in FIG. 12 includes a package-on-package structure 1234 coupled to the second face 1242 of the circuit board 1202 by coupling components 1228. The package-on-package structure 1234 may include an integrated circuit component 1226 and an integrated circuit component 1232 coupled together by coupling components 1230 such that the integrated circuit component 1226 is disposed between the circuit board 1202 and the integrated circuit component 1232. The coupling components 1228 and 1230 may take the form of any of the embodiments of the coupling components 1216 discussed above, and the integrated circuit components 1226 and 1232 may take the form of any of the embodiments of the integrated circuit component 1220 discussed above. The package-on-package structure 1234 may be configured in accordance with any of the package-on-package structures known in the art.

Figure 13:
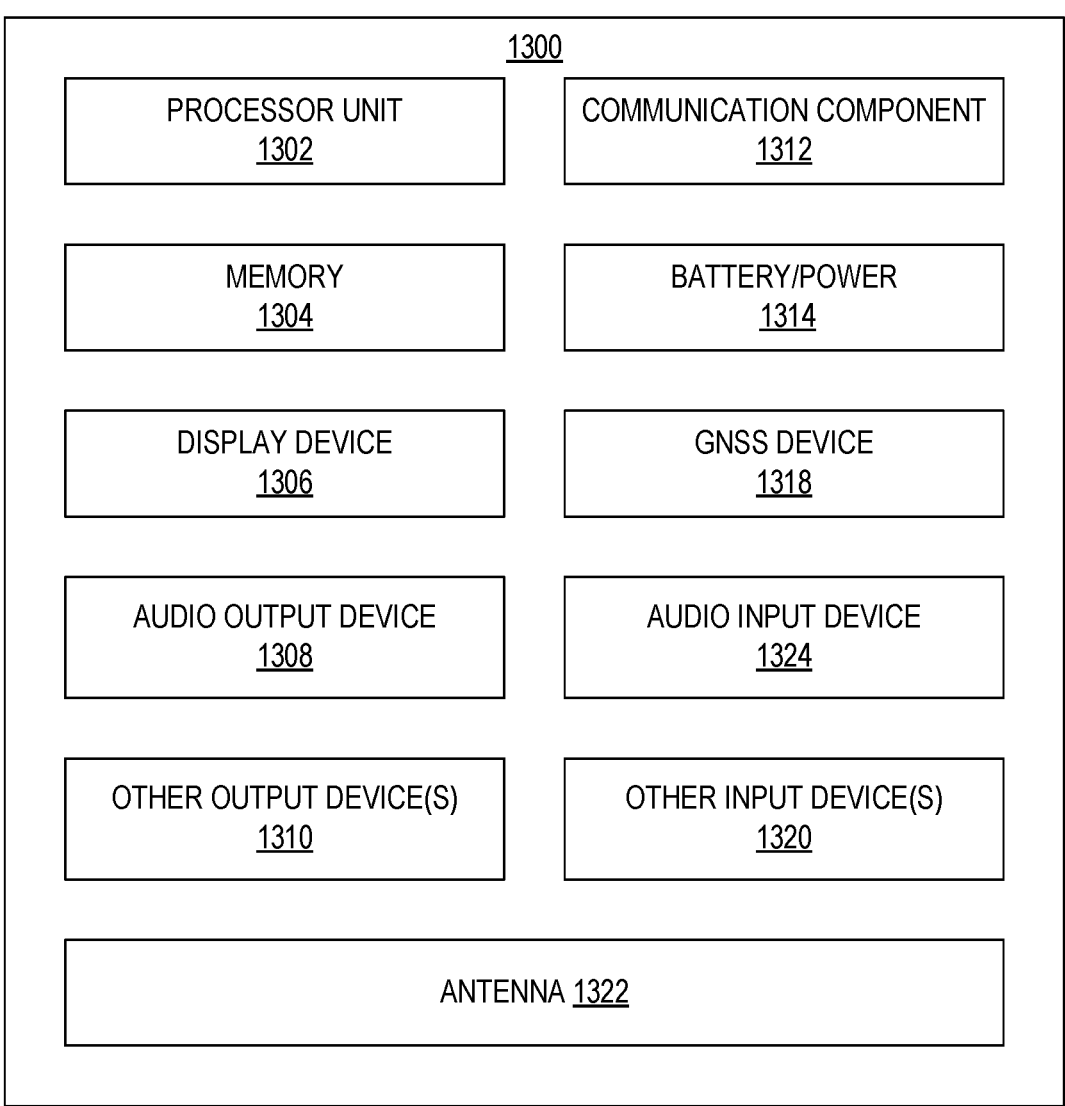
FIG. 13 illustrates a block diagram of an example electrical device in accordance with certain embodiments.

FIG. 13 is a block diagram of an example electrical device 1300 that may include one or more of the embodiments disclosed herein. In some embodiments, for example, the electrical device 1300 may include an EMI shield for memory 1304 according to any of the embodiments disclosed herein (e.g., EMI shield 114, 200, 400, 514, 614, 814, 900, 1014).

A number of components are illustrated in FIG. 13 as included in the electrical device 1300, but any one or more of these components may be omitted or duplicated, as suitable for the application. In some embodiments, some or all of the components included in the electrical device 1300 may be attached to one or more motherboards, mainboards, or system boards. In some embodiments, one or more of these components are fabricated onto a single system-on-a-chip (SoC) die.

Additionally, in various embodiments, the electrical device 1300 may not include one or more of the components illustrated in FIG. 13, but the electrical device 1300 may include interface circuitry for coupling to the one or more components. For example, the electrical device 1300 may not include a display device 1306, but may include display device interface circuitry (e.g., a connector and driver circuitry) to which a display device 1306 may be coupled. In another set of examples, the electrical device 1300 may not include an audio input device 1324 or an audio output device 1308, but may include audio input or output device interface circuitry (e.g., connectors and supporting circuitry) to which an audio input device 1324 or audio output device 1308 may be coupled.

The electrical device 1300 may include one or more processor units 1302 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1302 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1300 may include a memory 1304, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1304 may include memory that is located on the same integrated circuit die as the processor unit 1302. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1300 can comprise one or more processor units 1302 that are heterogeneous or asymmetric to another processor unit 1302 in the electrical device 1300. There can be a variety of differences between the processing units 1302 in a system in terms of a spectrum of metrics of merit including architectural, micro-architectural, thermal, power consumption characteristics, and the like. These differences can effectively manifest themselves as asymmetry and heterogeneity among the processor units 1302 in the electrical device 1300.

In some embodiments, the electrical device 1300 may include a communication component 1312 (e.g., one or more communication components). For example, the communication component 1312 can manage wireless communications for the transfer of data to and from the electrical device 1300. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1312 may operate in accordance with other wireless protocols in other embodiments. The electrical device 1300 may include an antenna 1322 to facilitate wireless communications and/or to receive other wireless communications (such as AM or FM radio transmissions).

In some embodiments, the communication component 1312 may manage wired communications, such as electrical, optical, or any other suitable communication protocols (e.g., IEEE 802.3 Ethernet standards). As noted above, the communication component 1312 may include multiple communication components. For instance, a first communication component 1312 may be dedicated to shorter-range wireless communications such as Wi-Fi or Bluetooth, and a second communication component 1312 may be dedicated to longer-range wireless communications such as global positioning system (GPS), EDGE, GPRS, CDMA, WiMAX, LTE, EV-DO, or others. In some embodiments, a first communication component 1312 may be dedicated to wireless communications, and a second communication component 1312 may be dedicated to wired communications.

The electrical device 1300 may include battery/power circuitry 1314. The battery/power circuitry 1314 may include one or more energy storage devices (e.g., batteries or capacitors) and/or circuitry for coupling components of the electrical device 1300 to an energy source separate from the electrical device 1300 (e.g., AC line power).

The electrical device 1300 may include a display device 1306 (or corresponding interface circuitry, as discussed above). The display device 1306 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1300 may include an audio output device 1308 (or corresponding interface circuitry, as discussed above). The audio output device 1308 may include any embedded or wired or wirelessly connected external device that generates an audible indicator, such speakers, headsets, or earbuds.

The electrical device 1300 may include an audio input device 1324 (or corresponding interface circuitry, as discussed above). The audio input device 1324 may include any embedded or wired or wirelessly connected device that generates a signal representative of a sound, such as microphones, microphone arrays, or digital instruments (e.g., instruments having a musical instrument digital interface (MIDI) output). The electrical device 1300 may include a Global Navigation Satellite System (GNSS) device 1318 (or corresponding interface circuitry, as discussed above), such as a Global Positioning System (GPS) device. The GNSS device 1318 may be in communication with a satellite-based system and may determine a geolocation of the electrical device 1300 based on information received from one or more GNSS satellites, as known in the art.

The electrical device 1300 may include other output device(s) 1310 (or corresponding interface circuitry, as discussed above). Examples of the other output device(s) 1310 may include an audio codec, a video codec, a printer, a wired or wireless transmitter for providing information to other devices, or an additional storage device.

The electrical device 1300 may include other input device(s) 1320 (or corresponding interface circuitry, as discussed above). Examples of the other input device(s) 1320 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1300 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a display device (e.g., monitor, television), a set-top box, an entertainment control unit, a video game console, a video playback device, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1300 may be any other electronic device that processes data. In some embodiments, the electrical device 1300 may comprise multiple discrete physical components. Given the range of devices that the electrical device 1300 can be manifested as in various embodiments, in some embodiments, the electrical device 1300 can be referred to as a computing device or a computing system.

While the concepts of the present disclosure are susceptible to various modifications and alternative forms, specific embodiments thereof have been shown by way of example in the drawings and are described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features. Further, it should be understood that the various embodiments shown in the figures are illustrative representations and are not necessarily drawn to scale.

Moreover, the illustrations and/or descriptions of various embodiments may be simplified or approximated for ease of understanding, and as a result, they may not necessarily reflect the level of precision nor variation that may be present in actual embodiments. For example, while some figures generally indicate straight lines, right angles, and smooth surfaces, actual implementations of the disclosed embodiments may have less than perfect straight lines and right angles, and some features may have surface topography or otherwise be non-smooth, given real-world limitations of fabrication processes. Similarly, illustrations and/or descriptions of how components are arranged may be simplified or approximated for ease of understanding and may vary by some margin of error in actual embodiments (e.g., due to fabrication processes, etc.).

Unless otherwise specified, the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

The terms "substantially," "close," "approximately," "near," and "about," generally refer to being within +/−10% of a target value (unless otherwise specified). Similarly, terms describing spatial relationships, such as "perpendicular," "orthogonal," or "coplanar," may refer to being substantially within the described spatial relationships (e.g., within +/−10 degrees of orthogonality).

Certain terminology may also be used in the foregoing description for the purpose of reference only, and thus are not intended to be limiting. For example, terms such as "upper," "lower," "above," "below," "bottom," and "top" refer to directions in the drawings to which reference is made. Terms such as "front," "back," "rear," and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

The terms "over", "under", "between", "adjacent", "to", and "on" as used herein may refer to a relative position of one layer or component with respect to other layers or components. For example, one layer "over", "under", or "on" another layer, "adjacent" to another layer, or bonded "to" another layer may be directly in contact with the other layer or may have one or more intervening layers. One layer "between" layers may be directly in contact with the layers or may have one or more intervening layers.

The meaning of "a," "an," and "the" include plural references. The meaning of "in" includes "in" and "on."

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

The term "package" generally refers to a self-contained carrier of one or more dice, where the dice are attached to or embedded in the package substrate, and may be encapsulated for protection, with integrated or wire-bonded interconnects between the dice, along with leads, pins, or bumps located on the external portions of the package substrate. The package may contain a single die, or multiple dice, providing respective functions. The package may be mounted on a printed circuit board for interconnection with other packaged integrated circuits and discrete components, forming a larger circuit.

The term "cored" generally refers to a substrate of an integrated circuit package built upon a board, card, or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

The term "coreless" generally refers to a substrate of an integrated circuit package having no core. The lack of a core may allow for higher-density package architectures, as the through-vias may have relatively large dimensions and pitch compared to high-density interconnects.

The term "land side" generally refers to the side of the substrate of the integrated circuit package closest to the plane of attachment to a printed circuit board, motherboard, or other package. This is in contrast to the term "die side", which generally refers to the side of the substrate of the integrated circuit package to which the die or dice are attached.

The terms "dielectric" and "dielectric material" generally refer to any type or number of non-electrically conductive materials. In some cases, dielectric material may be used to make up the structure of a package substrate. For example, dielectric material may be incorporated into an integrated circuit package as layers of laminate film or as a resin molded over integrated circuit dice mounted on the substrate.

The term "metallization" generally refers to metal layers formed on, over, and/or through the dielectric material of the package substrate. The metal layers are generally patterned to form metal structures such as traces and bond pads. The metallization of a package substrate may be confined to a single layer or in multiple layers separated by layers of dielectric.

The term "bond pad" generally refers to metallization structures that terminate integrated traces and vias in integrated circuit packages and dies. The term "solder pad" may be occasionally substituted for "bond pad" and may carry the same or similar meaning.

The term "bump" generally refers to a conductive layer or structure formed on a bond pad, which is typically made of solder or metal and has a round or curved shape, hence the term "bump".

The term "substrate" generally refers to a planar platform comprising dielectric and/or metallization structures. A substrate may mechanically support and electrically couple one or more IC dies on a single platform, with encapsulation of the one or more IC dies by a moldable dielectric material. A substrate may include bumps or pads as bonding interconnects on one or both sides. For example, one side of the substrate, generally referred to as the "die side", may include bumps or pads for chip or die bonding. The opposite side of the substrate, generally referred to as the "land side", may include bumps or pads for bonding the package to a printed circuit board.

The term "assembly" generally refers to a grouping of parts into a single functional unit. For example, certain parts may be permanently bonded together, integrated together, and/or mechanically assembled (e.g., where parts may be removable) into a functional unit.

The terms "coupled" or "connected" means a direct or indirect connection, such as a direct electrical, mechanical, magnetic, or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal.

EXAMPLES

Illustrative examples of the technologies described throughout this disclosure are provided below. Embodiments of these technologies may include any one or more, and any combination of, the examples described below. In some embodiments, at least one of the systems or components set forth in one or more of the preceding figures may be configured to perform one or more operations, techniques, processes, and/or methods as set forth in the following examples.

Example 1 includes an electromagnetic interference (EMI) shield, comprising: a housing to substantially enclose a memory module, wherein the housing and the memory module are to be coupled to a circuit board, wherein the housing is to extend at least partially underneath the memory module, and wherein the housing is openable or at least partially removable.

Example 2 includes the EMI shield of Example 1, wherein the housing comprises: a top portion, wherein the top portion is to extend over the memory module, and wherein the top portion is openable or removable; a plurality of side walls; and a bottom portion, wherein the bottom portion is to extend at least partially underneath the memory module.

Example 3 includes the EMI shield of Example 2, wherein the housing further comprises a flexible interface between the top portion and one of the side walls, wherein the flexible interface enables the top portion to open.

Example 4 includes the EMI shield of Example 3, wherein the housing further comprises a plurality of corner side covers to cover openings at corners of side walls adjacent to the flexible interface.

Example 5 includes the EMI shield of Example 4, further comprising a plurality of EMI gaskets, wherein the EMI gaskets are interior to the corner side covers.

Example 6 includes the EMI shield of any of Examples 2-5, wherein the housing is one piece.

Example 7 includes the EMI shield of any of Examples 2-6, wherein the top portion is a removable lid.

Example 8 includes the EMI shield of Example 7, wherein the housing is multiple pieces.

Example 9 includes the EMI shield of any of Examples 2-8, wherein the bottom portion comprises a conductive edge, wherein the conductive edge is to be electrically coupled to a ground contact on the circuit board.

Example 10 includes the EMI shield of any of Examples 2-9, wherein the bottom portion comprises one or more mechanical feet, wherein the one or more mechanical feet are to be coupled to the circuit board.

Example 11 includes the EMI shield of any of Examples 1-10, wherein the memory module is removable.

Example 12 includes the EMI shield of any of Examples 1-11, wherein the memory module is a dual in-line memory module.

Example 13 includes the EMI shield of any of Examples 1-12, wherein the memory module is a small outline dual in-line memory module.

Example 14 includes the EMI shield of any of Examples 1-13, wherein the memory module comprises a plurality of memory modules, wherein the housing is to substantially enclose the plurality of memory modules.

Example 15 includes a system, comprising: a circuit board; one or more memory modules coupled to the circuit board; and an electromagnetic interference (EMI) shield to substantially enclose the one or more memory modules, wherein the EMI shield is coupled to the circuit board, wherein a bottom portion of the EMI shield extends at least partially underneath the one or more memory modules, and wherein a top portion of the EMI shield is openable or removable.

Example 16 includes the system of Example 15, wherein the EMI shield comprises a flexible interface adjacent to the top portion, wherein the flexible interface enables the top portion to open.

Example 17 includes the system of Example 16, further comprising a plurality of clips coupled to the circuit board, wherein the clips are to hold the top portion of the EMI shield in place.

Example 18 includes the system of any of Examples 15-17, wherein the top portion is a removable lid.

Example 19 includes the system of any of Examples 15-18, wherein the circuit board comprises one or more ground contacts, wherein the EMI shield is electrically coupled to the one or more ground contacts.

Example 20 includes the system of any of Examples 15-19, further comprising a processor coupled to the circuit board.

Example 21 includes the system of Example 20, further comprising a system-on-a-chip coupled to the circuit board, wherein the system-on-a-chip comprises the processor and at least one of a graphics processing unit, a network interface controller, a storage device, a memory controller, or an input/output (I/O) controller.

Example 22 includes the system of any of Examples 15-21, further comprising one or more memory connectors coupled to the circuit board, wherein the one or more memory modules are removably coupled to the one or more memory connectors.

Example 23 includes the system of any of Examples 15-22, wherein the one or more memory modules are dual in-line memory modules.

Example 24 includes the system of any of Examples 15-23, wherein the one or more memory modules are small outline dual in-line memory modules.

Example 25 includes a method, comprising: receiving a circuit board, a memory connector, and an electromagnetic interference (EMI) shield, wherein the EMI shield comprises a top portion and a bottom portion, wherein the bottom portion is to extend at least partially underneath a memory module, and wherein the top portion is openable or removable; attaching the memory connector to the circuit board; attaching the EMI shield to the circuit board; and inserting a memory module into the memory connector.

Example 26 includes the method of Example 25, wherein attaching the EMI shield to the circuit board comprises: inserting the EMI shield into a plurality of clips; and attaching the EMI shield and the plurality of clips to the circuit board.

Example 27 includes the method of Example 25, wherein attaching the EMI shield to the circuit board comprises: inserting a temporary standoff between the EMI shield and the circuit board; attaching a plurality of clips to the circuit board; attaching the bottom portion of the EMI shield to the circuit board; and removing the temporary standoff.

Example 28 includes the method of any of Examples 25-27, wherein inserting the memory module into the memory connector comprises: opening the top portion of the EMI shield; inserting the memory module into the memory connector; and closing the top portion of the EMI shield.

Example 29 includes the method of Example 25, wherein attaching the EMI shield to the circuit board comprises attaching the bottom portion of the EMI shield to the circuit board.

Example 30 includes the method of Example 29, further comprising, after inserting the memory module into the memory connector, attaching the top portion of the EMI shield to the bottom portion of the EMI shield, wherein the top portion is a removable lid.

The invention claimed is:

1. An electromagnetic interference (EMI) shield, comprising:
a housing to substantially enclose a memory module, wherein the housing and the memory module are to be coupled to a circuit board, wherein the housing is to extend at least partially underneath the memory module, and wherein the housing is openable or at least partially removable, and wherein the housing comprises:
a top portion, wherein the top portion is to extend over the memory module, and wherein the top portion is openable or removable;
a plurality of side walls;
a bottom portion, wherein the bottom portion is to extend at least partially underneath the memory module;
a flexible interface between the top portion and one of the side walls, wherein the flexible interface enables the top portion to open; and
a plurality of corner side covers to cover openings at corners of side walls adjacent to the flexible interface;
a plurality of EMI gaskets, wherein the EMI gaskets are interior to the corner side covers.

2. The EMI shield of claim 1, wherein the top portion is a removable lid.

3. The EMI shield of claim 1, wherein the bottom portion comprises a conductive edge, wherein the conductive edge is to be electrically coupled to a ground contact on the circuit board.

4. The EMI shield of claim 1, wherein the bottom portion comprises one or more mechanical feet, wherein the one or more mechanical feet are to be coupled to the circuit board.

5. The EMI shield of claim 1, wherein the memory module is a small outline dual in-line memory module.

6. A system, comprising:

a circuit board;

one or more memory modules coupled to the circuit board; and an electromagnetic interference (EMI) shield to substantially enclose the one or more memory modules, wherein the EMI shield is coupled to the circuit board, and wherein the EMI shield comprises:

a top portion, wherein the top portion extends over the one or more memory modules, and wherein the top portion is openable or removable;

a plurality of side walls;

a bottom portion, wherein the bottom portion extends at least partially underneath the one or more memory modules;

a flexible interface between the top portion and one of the side walls, wherein the flexible interface enables the top portion to open; and a plurality of corner side covers to cover openings at corners of side walls adjacent to the flexible interface;

a plurality of EMI gaskets, wherein the EMI gaskets are interior to the corner side covers.

7. The system of claim 6, further comprising a plurality of clips coupled to the circuit board, wherein the clips are to hold the top portion of the EMI shield in place.

8. The system of claim 6, wherein the top portion is a removable lid.

9. The system of claim 6, wherein the circuit board comprises one or more ground contacts, wherein the EMI shield is electrically coupled to the one or more ground contacts.

10. The system of claim 6, further comprising a processor coupled to the circuit board.

11. The system of claim 10, further comprising a system-on-a-chip coupled to the circuit board, wherein the system-on-a-chip comprises the processor and at least one of a graphics processing unit, a network interface controller, a storage device, a memory controller, or an input/output (I/O) controller.

12. The system of claim 6, further comprising one or more memory connectors coupled to the circuit board, wherein the one or more memory modules are removably coupled to the one or more memory connectors.

13. The system of claim 6, wherein the one or more memory modules are small outline dual in-line memory modules.

14. A method, comprising:

receiving a circuit board, a memory connector, and an electromagnetic interference (EMI) shield, wherein the EMI shield comprises:

a top portion, wherein the top portion extends over a memory module, and wherein the top portion is openable or removable;

a plurality of side walls;

a bottom portion, wherein the bottom portion extends at least partially underneath the memory module;

a flexible interface between the top portion and one of the side walls, wherein the flexible interface enables the top portion to open;

a plurality of corner side covers to cover openings at corners of side walls adjacent to the flexible interface; and a plurality of EMI gaskets, wherein the EMI gaskets are interior to the corner side covers;

attaching the memory connector to the circuit board;

attaching the EMI shield to the circuit board; and inserting a memory module into the memory connector.

15. The method of claim 14, wherein attaching the EMI shield to the circuit board comprises:

inserting the EMI shield into a plurality of clips; and attaching the EMI shield and the plurality of clips to the circuit board.

* * * * *